United States Patent
Lin et al.

(10) Patent No.: US 11,316,308 B2
(45) Date of Patent: Apr. 26, 2022

(54) ADAPTER, MULTI-DEVICE DETECTION SYSTEM AND DETECTION METHOD THEREOF

(71) Applicant: JRD COMMUNICATION (SHENZHEN) LTD., Shenzhen (CN)

(72) Inventors: Junlan Lin, Shenzhen (CN); Maolin Gong, Shenzhen (CN)

(73) Assignee: JRD COMMUNICATON (SHENZHEN) LTD., Shenzhen (CN)

( * ) Notice: Subject to any disclaimer, the term of this patent is extended or adjusted under 35 U.S.C. 154(b) by 3 days.

(21) Appl. No.: 16/769,597

(22) PCT Filed: Dec. 5, 2018

(86) PCT No.: PCT/CN2018/119304
§ 371 (c)(1),
(2) Date: Jun. 4, 2020

(87) PCT Pub. No.: WO2019/109933
PCT Pub. Date: Jun. 13, 2019

(65) Prior Publication Data
US 2020/0313366 A1   Oct. 1, 2020

(30) Foreign Application Priority Data

Dec. 5, 2017   (CN) .......................... 201711266781.9

(51) Int. Cl.
*G01R 27/02* (2006.01)
*H01R 13/66* (2006.01)
(Continued)

(52) U.S. Cl.
CPC ......... *H01R 13/6683* (2013.01); *G01R 27/02* (2013.01); *G01R 31/00* (2013.01); *H01R 31/065* (2013.01)

(58) Field of Classification Search
CPC ....... G01R 27/02; G01R 31/00; G06F 13/385; G06F 13/4295; H01R 13/6683; H01R 2201/16; H01R 2201/20; H01R 31/065
See application file for complete search history.

(56) References Cited

U.S. PATENT DOCUMENTS 7,644,217 B2 *   1/2010   Butler ................... G06F 1/3253
                                                  710/302
9,606,953 B2 *   3/2017   Talmola ............... G06F 13/4081
(Continued)

FOREIGN PATENT DOCUMENTS

CN      105868139 A      8/2016
CN      205644528 U     10/2016
(Continued)

OTHER PUBLICATIONS

International search report,PCT/CN2018/119304, dated Mar. 6, 2019 (3 pages).
(Continued)

*Primary Examiner* — Vinh P Nguyen

(57) ABSTRACT

The present disclosure provides an adapter, a multi-device detection system and a detection method. The adapter includes a circuit board, a male connector, a first female connector and a second female connector arranged on the circuit board. The male connector is electrically connected to the first female connector and the second female connector. The male connector is provided with two independent D+ pins and two independent D− pins. One of the two independent D+ pins is electrically connected to a D+ pin of the first female connector, and the other one of the two independent D+ pins is electrically connected to a D+ pin of the second female connector. One of the two independent D− pins is electrically connected to a D− pin of the first female connector, and the other one of the two independent D− pins is electrically connected to a D− pin of the second female connector.

(Continued)

female connector. The present disclosure further provides a multi-device detection system and a detection method thereof.

17 Claims, 2 Drawing Sheets

(51) Int. Cl.
*G01R 31/00* (2006.01)
*H01R 31/06* (2006.01)

(56) References Cited

U.S. PATENT DOCUMENTS

| | | | |
|---|---|---|---|
| 9,625,988 B1 | 4/2017 | Agarwal et al. | |
| 9,798,689 B2* | 10/2017 | Hundal | C01B 32/05 |
| 9,891,684 B2 | 2/2018 | Liu et al. | |
| 10,009,029 B1* | 6/2018 | Chen | H03K 19/018521 |
| 10,067,554 B2 | 9/2018 | Abu Hilal | |
| 10,186,815 B2* | 1/2019 | Shen | H01R 24/60 |
| 10,333,260 B2* | 6/2019 | Card | G06F 1/263 |
| 10,339,089 B2 | 7/2019 | Gerber et al. | |
| 10,411,426 B2* | 9/2019 | Bae | H01R 31/065 |
| 10,431,939 B2* | 10/2019 | Oporta | H03K 19/0185 |
| 10,489,325 B2* | 11/2019 | Hsieh | G06F 13/4068 |
| 2008/0215765 A1* | 9/2008 | Butler | G06F 13/4081 710/15 |
| 2015/0261714 A1 | 9/2015 | Talmola | |

FOREIGN PATENT DOCUMENTS

| | | |
|---|---|---|
| CN | 106207687 A | 12/2016 |
| CN | 106532382 A | 3/2017 |
| CN | 106603755 A | 4/2017 |
| CN | 106785699 A | 5/2017 |
| CN | 106877103 A | 6/2017 |
| CN | 107145331 A | 9/2017 |
| CN | 107257406 A | 10/2017 |
| CN | 108054541 A | 5/2018 |

OTHER PUBLICATIONS

First Office Action from China patent office in a counterpart Chinese patent Application 201711266781.9, dated Mar. 11, 2019 (10 pages).
Second Office Action from China patent office in a counterpart Chinese patent Application 201711266781.9, dated Sep. 30, 2019 (8 pages).
Third Office Action from China patent office in a counterpart Chinese patent Application 201711266781.9, dated Mar. 16, 2020 (10 pages).

* cited by examiner

| A1 | A2 | A3 | A4 | A5 | A6 | A7 | A8 | A9 | A10 | A11 | A12 |
|---|---|---|---|---|---|---|---|---|---|---|---|
| GND | TX1+ | TX1− | $V_{BUS}$ | CC1 | D+ | D− | SUB1 | $V_{BUS}$ | RX2− | RX2+ | GND |
| GND | RX1+ | RX1− | $V_{BUS}$ | SUB1 | D− | D+ | CC1 | $V_{BUS}$ | TX2− | TX2+ | GND |
| B1 | B2 | B3 | B4 | B5 | B6 | B7 | B8 | B9 | A10 | B11 | B12 |

ADAPTER, MULTI-DEVICE DETECTION SYSTEM AND DETECTION METHOD THEREOF

CROSS-REFERENCE TO RELATED APPLICATIONS

The present application is a 35 U.S.C. § 371 National Phase conversion of International (PCT) Patent Application No. PCT/CN2018/119304 filed on Dec. 5, 2018, which claims foreign priority to Chinese Patent Application No. 201711266781.9, filed on Dec. 5, 2017 in the China National Intellectual Property Administration, the entire contents of which are hereby incorporated by reference.

FIELD

The described embodiments relate to an electronic device, and more particularly, to an adapter, a multi-device detection system and a detection method thereof.

BACKGROUND

Since a USB Type-C interface has symmetrically set pins, it may realize inserting in a direction and a reverse direction, to avoid a problem of inserting a USB interface in a wrong direction during use, so that may greatly improve a user experience. Thus, a traditional USB interface is replaced in more and more electronic devices, such as mobile phones and tablet computers, with the Type-C interface. It may greatly improve an experience of using electronic devices. In addition, since uniformity of the Type-C interface, the Type-C interface may realize charging and audio output functions, so that many manufacturers cancel an earphone interface in mobile phones and connect an earphone through the Type-C interface. However, it also brings some problems. For example, since there is only one Type-C interface, only one external device may be connected to the Type-C interface, so that multiple-devices simultaneously connecting to a mobile phone cannot be realized, and resulting in inconvenience in some scenarios.

SUMMARY

The technical problem to be solved by the present disclosure is to overcome shortcomings of the related art, to provide an adapter configured to realize multiple-devices simultaneously connecting to a mobile terminal, and a multi-device detection system configured to identify multiple-devices.

In order to achieve the above-mentioned purpose the present disclosure adopts the following technical solution.

The present disclosure provides a detection method for a multi-device detection system, including: detecting resistance values of a CC1 pin and a CC2 pin on a third female connector, by a control motherboard; determining a type of connected device on a first female connector and a second female connector, by the control motherboard, according to the detected resistance values of the CC1 pin and the CC2 pin on a third female connector; wherein the type of connected device is one of an earphone, a USB flash drive, a charger, and a mobile phone with a full Type-C function.

In an embodiment, when the resistance value of one of the CC1 pin and the CC2 pin is the first predetermined resistance value and the resistance value of the other one of the CC1 pin and the CC2 pin is a second predetermined resistance value, and when the second predetermined resistance value is greater than the first predetermined resistance value, the control motherboard determines that one of the first female connector and the second female connector is connected to an earphone, and the other one of the first female connector and the second female connector is connected to a USB flash drive.

In an embodiment, when the resistance value of one of the CC1 pin and the CC2 pin is the first predetermined resistance value and the resistance value of the other one of the CC1 pin and the CC2 pin is a third predetermined resistance value, and when the first predetermined resistance value is greater than the third predetermined resistance value, the control motherboard determines that one of the first female connector and the second female connector is connected to an earphone, and the other one of the first female connector and the second female connector is connected to a charger.

In an embodiment, when the resistance value of one of the CC1 pin and the CC2 pin is the third predetermined resistance value and the resistance value of the other one of the CC1 pin and the CC2 pin is the fourth predetermined resistance value, and when the fourth predetermined resistance value is greater than the second predetermined resistance value, the control motherboard determines that one of the first female connector and the second female connector is connected to an earphone, and the other one of the first female connector and the second female connector is connected to a charger.

In an embodiment, when the resistance value of one of the CC1 pin and the CC2 pin is the second predetermined resistance value and the resistance value of the other one of the CC1 pin and the CC2 pin is the third predetermined resistance value, the control motherboard determines that one of the first female connector and the second female connector is connected to an earphone, and the other one of the first female connector and the second female connector is connected to a mobile phone with a full Type-C function.

In an embodiment, the male connector is configured to connect a mobile phone, and the first female connector and the second female connector are respectively configured to connect any one of an earphone, a USB flash drive, a charger, and a mobile phone with a full Type-C function.

The present disclosure further provides an adapter, including a circuit board, a male connector, a first female connector and a second female connector respectively arranged on the circuit board; wherein the male connector is a Type-C male connector, and both the first female connector and the second female connector are a Type-C female connector; the male connector is electrically connected to the first female connector and the second female connector; respectively; wherein the male connector is provided with two independent D+ pins and two independent D− pins; one of the two independent D+ pins is electrically connected to a D+ pin of the first female connector, and the other one of the two independent D+ pins is electrically connected to a D+ pin of the second female connector; one of the two independent D− pins is electrically connected to a D− pin of the first female connector, and the other one of the two independent D− pins is electrically connected to a D− pin of the second female connector.

In an embodiment, the male connector is configured to connect a mobile phone, and the first female connector and the second female connector are respectively configured to connect any one of an earphone, a USB flash drive; a charger; and a mobile phone with a full Type-C function.

The present disclosure further provides a multi-device detection system, including a mobile terminal and a adapter; wherein the adapter includes a circuit board, a male connector, a first female connector and a second female connector respectively arranged on the circuit board; wherein the male connector is a Type-C male connector, and both the first female connector and the second female connector are a Type-C female connector; the male connector is electrically connected to the first female connector and the second female connector, respectively; wherein the male connector is provided with two independent D+ pins and two independent D− pins; one of the two independent pins is electrically connected to a D+ pin of the first female connector, and the other one of the two independent D+ pins is electrically connected to a D+ pin of the second female connector; one of the two independent D− pins is electrically connected to a D− pin of the first female connector, and the other one of the two independent D− pins is electrically connected to a D− pin of the second female connector; wherein the mobile terminal includes a control motherboard and a third female connector arranged on the control motherboard; and the third female connector is a Type-C female connector; wherein the third female connector is provided with two independent D+ pins and two independent D− pins; the male connector is inserted into the third female connector; the two independent D+ pins of the male connector respectively correspond to the two independent D+ pins of the third female connector in an electrical connection; the two independent D− pins of the male connector respectively correspond to the two independent D− pins of the third female connector in an electrical connection; the control motherboard is configured to determine a type of connected device on the first female connector and the second female connector.

In an embodiment, the male connector is configured to connect a mobile phone, and the first female connector and the second female connector are respectively configured to connect any one of an earphone, a USB flash drive, a charger, and a mobile phone with a full Type-C function.

The present disclosure provides an adapter, a multi-device detection system and a detection method thereof. By the adapter, multiple-devices simultaneously connecting to a mobile terminal may be realized. In addition, by detecting resistance values of two CC pins on a mobile terminal, a type of connected device may be detected, and the mobile terminal may identify the connected device.

DETAILED DESCRIPTION

In order to make the purposes, the technical solutions, and the advantages of the present disclosure clearer, the present disclosure will be further described in detail below in conjunction with the accompanying drawings and embodiments. It should be understood that the specific embodiments described herein are only used to explain the present disclosure, and are not intended to limit the present disclosure.

Embodiment 1

Figures 1, 2:
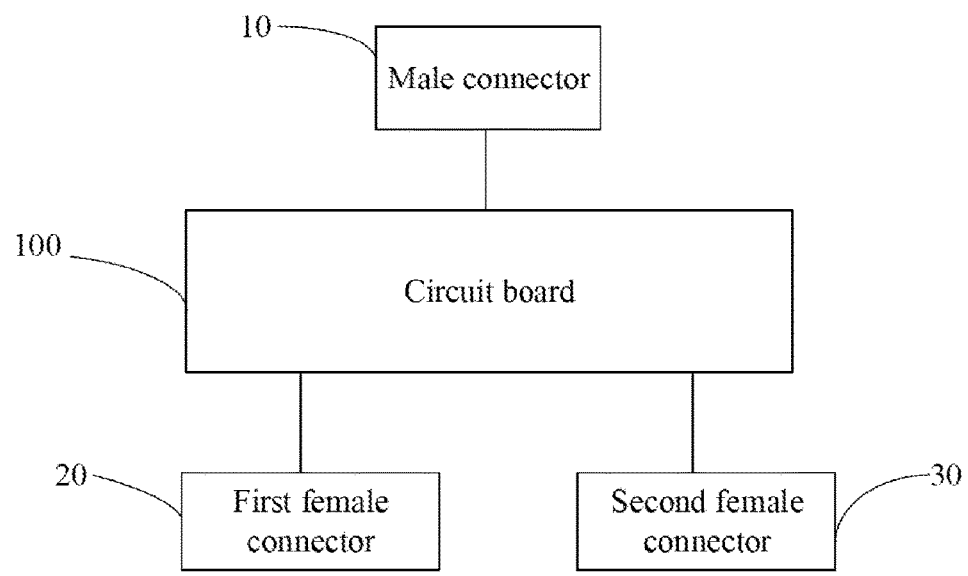
FIG. 1 is a structural illustration of an adapter in accordance with an embodiment in the present disclosure.
FIG. 2 is a pin definition of a Type-C female connector and a Type-C male connector in accordance with an embodiment in the present disclosure.

Referring to FIG. 1, an adapter of this embodiment may include a circuit board and a male connector 10, a first female connector 20 and a second female connector 30 respectively provided on the circuit board. The male connector 10 may be a Type-C male connector and the first female connector 20 and the second female connector 30 may be both a Type-C female connector. The male connector 10 may be electrically connected to the first female connector 20 and the second female connector 30, respectively. The male connector 10 may be configured to connect a mobile terminal such as a mobile phone. The first female connector 20 and the second female connector 30 may be simultaneously connected to two devices, so that the two devices may be simultaneously connected to the mobile phone.

FIG. 2 illustrates a pin definition of a Type-C female connector and a Type-C male connector in accordance with an embodiment in the present disclosure. The male connector 10 may provided with two independent D+ pins and two independent D− pins. One of the two independent D+ pins on the male connector 10 may be electrically connected to a D+ pin of the first female connector 20. The other one of the two independent D+ pins may be electrically connected to a D+ pin of the second female connector 30. One of the two independent D− pins may be electrically connected to a D− pin of the first female connector 20, and the other one of the two independent D− pins may be electrically connected to a D− pin of the second female connector 30. It should be noted that, in this embodiment, both the first female connector 20 and the second female connector 30 follow the Type-C protocol, i.e., the two D+ pins on the first female connector 20 may be conductive, and the two D− pins on the first female connector 20 may be conductive. The two D+ pins on the second female connector 30 may be conductive, and the two D− pins on the second female connector 30 may be conductive.

In this embodiment, the first female connector 20 and the second female connector 30 may be respectively configured to connect any one of an earphone, a USB flash drive, a charger, and a mobile phone with a full Type-C function.

Embodiment 2

Figure 3:
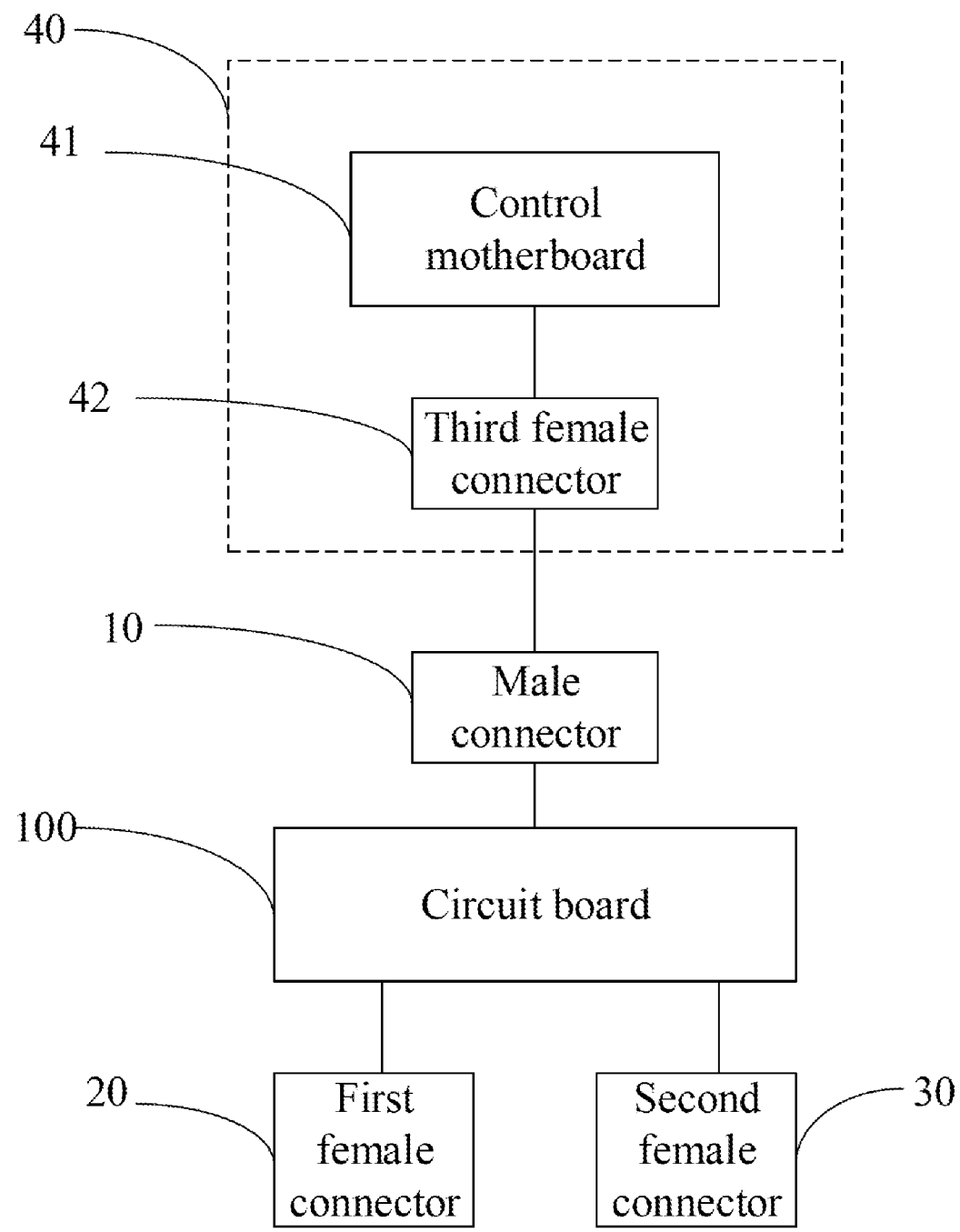
FIG. 3 is a structural illustration of a multi-device detection system in accordance with an embodiment in the present disclosure.

Referring to FIG. 3, the multi-device detection system provided in this embodiment may include a mobile terminal 40 and the above-mentioned adapter. The mobile terminal 40 may include a control motherboard 41 and a third female connector 42 provided on the control motherboard 41. The third female connector 42 may be a Type-C female connector as shown in FIG. 2. In this embodiment, the third female connector 42 may be provided with two independent D+ pins and two independent D− pins. The male connector 10 may be inserted into the third female connector 42. The two independent D+ pins of the male connector 10 may respectively correspond to the two pairs of independent D+ pins of the third female connector 42. The two independent D− pins of the male connector 10 may respectively correspond to the two independent D− pins of the third female connector 42. The control motherboard 41 may be configured to determine a type of connected device on the first female connector 20 and the second female connector 30, so that communication between the connected devices and the mobile terminal 40 may be established more conveniently.

Embodiment 3

A multi-device detection method is provided in this embodiment. The multi-device detection method may include operations in the following blocks.

Block 1, resistance values of a CC1 pin and a CC2 pin on a third female connector 42, may be detected by a control motherboard 41.

Block 2, a type of connected device on a first female connector 20 and a second female connector 30, may be determined by the control motherboard 41, according to the detected resistance values of the CC1 pin and the CC2 pin on a third female connector 42.

When the resistance value of one of the CC1 pin and the CC2 pin is a first predetermined resistance value and the resistance value of the other one of the CC1 pin and the CC2 pin is a second predetermined resistance value, and when the second predetermined resistance value is greater than the first predetermined resistance value, the control motherboard 41 may determine that one of the first female connector 20 and the second female connector 30 is connected to an earphone, and the other one of the first female connector 20 and the second female connector 30 is connected to a USB flash drive.

When the resistance value of one of the CC1 pin and the CC2 pin is the first predetermined resistance value and the resistance value of the other one of the CC1 pin and the CC2 pin is a third predetermined resistance value, and when the first predetermined resistance value is greater than the third predetermined resistance value, the control motherboard 41 may determine that one of the first female connector 20 and the second female connector 30 is connected to an earphone, and the other one of the first female connector 20 and the second female connector 30 is connected to a charger.

When the resistance value of one of the CC1 pin and the CC2 pin is the third predetermined resistance value and the resistance value of the other one of the CC1 pin and the CC2 pin is a fourth predetermined resistance value, and when the fourth predetermined resistance value is greater than the second predetermined resistance value, the control motherboard 41 may determine that one of the first female connector 20 and the second female connector 30 is connected to an earphone, and the other one of the first female connector 20 and the second female connector 30 is connected to a charger.

When the resistance value of one of the CC1 pin and the CC2 pin is the second predetermined resistance value and the resistance value of the other one of the CC1 pin and the CC2 pin is the third predetermined resistance value, the control motherboard 41 may determine that one of the first female connector 20 and the second female connector 30 is connected to an earphone, and the other one of the first female connector 20 and the second female connector 30 is connected to a mobile phone with a full Type-C function.

When the resistance values of the CC1 pin and the CC2 pin are both the first predetermined resistance value, the control motherboard 41 may determine that one of the first female connector 20 and the second female connector 30 is connected a USB flash drive, and the other one of first female connector 20 and the second female connector 30 is connected to a charger. When the resistance values of the CC1 pin and the CC2 pin are both the fourth predetermined resistance, the control motherboard 41 may determine that both the first female connector 20 and the second female connector 30 are connected to a USB flash drive.

The Type-C protocol defines two pull-down resistors Ra and Rd in a pull-down mode. The value of Ra may be in a range of 800Ω to 1200Ω and the value of Rd may be 5100Ω. The value of the first predetermined resistance in this embodiment may be a parallel resistance of Ra and Rd with a value in a range of 692Ω to 972Ω. The value of the second predetermined resistance may be Ra with a value in a range of 800Ω to 1200Ω. The third predetermined resistance may be a parallel resistance of Ra and Ra with a value in a range of 400Ω to 600Ω. The fourth predetermined resistance may be a parallel resistance of Rd and Rd with a value of 2550Ω.

In an actual use of detection process, it is generally that one device is inserted first, and then another device is inserted. Therefore, after the first device is inserted, according to the Type-C protocol, the control board 41 may determine a type of the first device according to detected resistance values of the CC1 pin and the CC2 pin. After a second device is inserted, the control motherboard 41 may determine types of the two devices based on the detected resistance values of the CC1 pin and the CC2 pin. Since the type of the first device is determined, the type of the second device inserted later may also be determined.

The present disclosure provides an adapter, a multi-device detection system, and a multi-device detection method. By the adapter, multiple-devices simultaneously connecting to a mobile terminal may be realized. In addition, by detecting resistance values of two CC pins on a mobile terminal, a type of connected device may be detected, and the mobile terminal may identify the connected device.

It is understood that the descriptions above are only embodiments of the present disclosure. It is not intended to limit the scope of the present disclosure. Any equivalent transformation in structure and/or in scheme referring to the instruction and the accompanying drawings of the present disclosure, and direct or indirect application in other related technical field, are included within the scope of the present disclosure.

What is claimed is:

1. A detection method for a multi-device detection system, comprising:
   detecting resistance values of a CC1 pin and a CC2 pin on a third female connector, by a control motherboard;
   determining a type of connected device on a first female connector and a second female connector, by the control motherboard, according to the detected resistance values of the CC1 pin and the CC2 pin on a third female connector;
   wherein the type of connected device is one of an ear phone, a USB flash drive, a charger, and a mobile phone with a full Type-C function; and
   wherein the third female connector arranged on the control motherboard, the first female connector, the second female connector and a male connector are arranged on a circuit board, and the male connector is capable of being inserted into the third female connector.

2. The method as claimed in claim 1, wherein
   when the resistance value of one of the CC1 pin and the CC2 pin is a first predetermined resistance value and the resistance value of the other one of the CC1 pin and the CC2 pin is a second predetermined resistance value, and when the second predetermined resistance value is greater than the first predetermined resistance value, the control motherboard determines that one of the first female connector and the second female connector is connected to an earphone, and the other one of the first female connector and the second female connector is connected to a USB flash drive; and
   a Type-C protocol is applied to the male connector, the first female connector, the second female connector, and the third female connector, the Type-C protocol defines two pull-down resistors Ra and Rd in a pull-down mode, the first predetermined resistance value is a parallel resistance of the Ra and the Rd, the second predetermined resistance value is a resistance of the Ra.

3. The method as claimed in claim 2, wherein
when the resistance value of one of the CC1 pin and the CC2 pin is the first predetermined resistance value and the resistance value of the other one of the CC1 pin and the CC2 pin is a third predetermined resistance value, and when the first predetermined resistance value is greater than the third predetermined resistance value, the control motherboard determines that one of the first female connector and the second female connector is connected to an earphone, and the other one of the first female connector and the second female connector is connected to a charger; and
the third predetermined resistance value a parallel resistance of the Ra and another Ra.

4. The method as claimed in claim 3, wherein
when the resistance value of one of the CC1 pin and the CC2 pin is the third predetermined resistance value and the resistance value of the other one of the CC1 pin and the CC2 pin is a fourth predetermined resistance value, and when the fourth predetermined resistance value is greater than the second predetermined resistance value, the control motherboard determines that one of the first female connector and the second female connector is connected to an earphone, and the other one of the first female connector and the second female connector is connected to a charger; and
the fourth predetermined resistance value a parallel resistance of the Rd and another Rd.

5. The method as claimed in claim 4, wherein
when the resistance value of one of the CC1 pin and the CC2 pin is the second predetermined resistance value and the resistance value of the other one of the CC1 pin and the CC2 pin is the third predetermined resistance value, the control motherboard determines that one of the first female connector and the second female connector is connected to an earphone, and the other one of the first female connector and the second female connector is connected to a mobile phone with a full Type-C function.

6. The method as claimed in claim 4, wherein
wherein when the resistance values of the CC1 pin and the CC2 pin are both the fourth predetermined resistance, the control motherboard determines that both the first female connector and the second female connector are connected to a USB flash drive.

7. The method as claimed in claim 4, wherein
the fourth predetermined resistance is a parallel resistance of Ra and Rd of 2550Ω;
wherein the Ra and the Rd are pull-down resistors defined in a Type-C protocol in a pull-down mode.

8. The method as claimed in claim 3, wherein
wherein when the resistance values of the CC1 pin and the CC2 pin are both the first predetermined resistance value, the control motherboard determines that one of the first female connector and the second female connector is connected to a USB flash drive, and the other one of first female connector and the second female connector is connected to a charger.

9. The method as claimed in claim 3, wherein
the third predetermined resistance is a parallel resistance of Ra and Rd in a range of 400Ω to 600Ω;
wherein the Ra and the Rd are pull-down resistors defined in a Type-C protocol in a pull-down mode.

10. The method as claimed in claim 2, wherein
the first predetermined resistance is a parallel resistance of Ra and Rd in a range of 692Ω to 972Ω;
wherein the Ra and the Rd are pull-down resistors defined in a Type-C protocol in a pull-down mode.

11. The method as claimed in claim 2, wherein
the second predetermined resistance is resistance of Ra in a range of 800Ω to 1200Ω;
wherein the Ra is a pull-down resistor defined in a Type-C protocol in a pull-down mode.

12. The method as claimed in claim 1, wherein
the male connector is configured to connect a mobile phone, the mobile phone comprises the control motherboard and the third female connector, and the first female connector and the second female connector are respectively configured to connect any one of an earphone, a USB flash drive, a charger, and a mobile phone with a full Type-C function.

13. The method as claimed in claim 1, wherein
when a first device is connected to the multi-device detection system, the control motherboard determines a type of the first device, according to the resistance values of the CC1 pin and the CC2 pin;
when a second device is connected to the multi-device detection system, the control motherboard determines the type of the first device and a type of the second device, according to the resistance values of the CC1 pin and the CC2 pin, so that the type of the second device is determined.

14. An adapter, comprising
a circuit board, a male connector, a first female connector and a second female connector respectively arranged on the circuit board;
wherein the male connector is a Type-C male connector, and both the first female connector and the second female connector are a Type-C female connector; the male connector is electrically connected to the first female connector and the second female connector, respectively;
wherein the male connector is provided with two independent D+ pins and two independent D− pins; one of the two independent D+ pins is electrically connected to a D+ pin of the first female connector, and the other one of the two independent D+ pins is electrically connected to a D+ pin of the second female connector; one of the two independent D− pins is electrically connected to a D− pin of the first female connector, and the other one of the two independent D− pins is electrically connected to a D− pin of the second female connector.

15. The adapter as claimed in claim 14, wherein
the male connector is configured to connect a mobile phone, and the first female connector and the second female connector are respectively configured to connect any one of an earphone, a USB flash drive, a charger, and a mobile phone with a full Type-C function.

16. A multi-device detection system, comprising a mobile terminal and a adapter; wherein the adapter comprises a circuit board, a male connector, a first female connector and a second female connector respectively arranged on the circuit board;
wherein the male connector is a Type-C male connector, and both the first female connector and the second female connector are a Type-C female connector; the male connector is electrically connected to the first female connector and the second female connector, respectively;
wherein the male connector is provided with two independent D+ pins and two independent D− pins; one of the two independent D+ pins is electrically connected to a D+ pin of the first female connector, and the other one of the two independent D+ pins is electrically connected to a D+ pin of the second female connector; one of the two independent D− pins is electrically connected to a D− pin of the first female connector, and the other one of the two independent D− pins is electrically connected to a D− pin of the second female connector;

wherein the mobile terminal comprises a control motherboard and a third female connector arranged on the control motherboard; and the third female connector is a Type-C female connector;

wherein the third female connector is provided with two independent D+ pins and two independent D− pins; the male connector is inserted into the third female connector; the two independent D+ pins of the male connector respectively correspond to the two independent D+ pins of the third female connector in an electrical connection; the two independent D− pins of the male connector respectively correspond to the two independent D− pins of the third female connector in an electrical connection; the control motherboard is configured to determine a type of connected device on the first female connector and the second female connector.

17. The multi-device detection system as claimed in claim 16, wherein the male connector is configured to connect a mobile phone, and the first female connector and the second female connector are respectively configured to connect any one of an ear phone, a USB flash drive, a charger, and a mobile phone with a full Type-C function.

* * * * *